United States Patent
Cao et al.

(10) Patent No.: US 11,539,010 B2
(45) Date of Patent: Dec. 27, 2022

(54) DISPLAY SUBSTRATE AND DISPLAY DEVICE IN WHICH DIFFERENCE IN DEFORMATION BETWEEN CENTRAL AND PERIPHERAL PORTIONS OF DISPLAY REGION IS ELIMINATED DURING STRETCH OR COMPRESSION

(71) Applicant: BOE Technology Group Co., Ltd., Beijing (CN)

(72) Inventors: Fangxu Cao, Beijing (CN); Pinfan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 177 days.

(21) Appl. No.: 17/041,176

(22) PCT Filed: Dec. 2, 2019

(86) PCT No.: PCT/CN2019/122392
§ 371 (c)(1),
(2) Date: Sep. 24, 2020

(87) PCT Pub. No.: WO2020/114349
PCT Pub. Date: Jun. 11, 2020

(65) Prior Publication Data
US 2021/0013434 A1    Jan. 14, 2021

(30) Foreign Application Priority Data
Dec. 3, 2018 (CN) .......................... 201811465167.X

(51) Int. Cl.
*H01L 51/00* (2006.01)
*H01L 27/32* (2006.01)

(52) U.S. Cl.
CPC ...... *H01L 51/0097* (2013.01); *H01L 27/3244* (2013.01); *H01L 2251/5338* (2013.01)

(58) Field of Classification Search
None
See application file for complete search history.

(56) References Cited

U.S. PATENT DOCUMENTS

| 2014/0144480 A1 | 5/2014 | Lee |
| 2015/0048349 A1 | 2/2015 | Kawata et al. |

(Continued)

FOREIGN PATENT DOCUMENTS

| CN | 105514115 A | 4/2016 |
| CN | 107195252 A | 9/2017 |

(Continued)

OTHER PUBLICATIONS

Office Action dated Apr. 2, 2020 for application No. CN201811465167.X with English translation attached.

*Primary Examiner* — J. E. Schoenholtz
(74) *Attorney, Agent, or Firm* — Nath, Goldberg & Meyer; Joshua B. Goldberg

(57) ABSTRACT

A display substrate and a display device are provided. The display substrate includes a base layer that includes at least a display region. The display region includes a plurality of opening regions, and each of the plurality of opening regions includes a plurality of islands spaced apart from each other by a plurality of openings and connected to each other by a plurality of bridges. At least two of the plurality of opening regions have different elastic moduli.

20 Claims, 7 Drawing Sheets

(56) References Cited

U.S. PATENT DOCUMENTS

2016/0320878 A1   11/2016  Hong et al.
2018/0052493 A1    2/2018  Hong et al.
2020/0212117 A1*  7/2020  Jeon .................... H01L 27/3218

FOREIGN PATENT DOCUMENTS

| CN | 107221549 A | 9/2017 |
| CN | 107340915 A | 11/2017 |
| CN | 108878486 A | 11/2018 |
| CN | 109599402 A | 4/2019 |
| WO | 2011008459 A2 | 1/2011 |

\* cited by examiner

| Serial number | Length or width of an island | Length of a bridge | Length of an opening | Ratio of a width of an island to a length of a bridge | Width of an opening | Overall amount of deformation under a same stretching force | Stretching force under a same overall amount of deformation | Elastic modulus |
|---|---|---|---|---|---|---|---|---|
| 1~2 | 400 | 80 | 720 | 5 | 80 | 3% | 120gf | 1.20E+08 |
| 3 | 400 | 40 | 810 | 10 | 90 | 9.40% | 65gf | 7.00E+07 |
| 4~5 | 400 | 40 | 900 | 10 | 180 | 10.40% | 59gf | 6.40E+07 |
| 6 | 400 | 20 | 790 | 20 | 20 | 13% | 47gf | 5.10E+07 |
| 7 | 200 | 40 | 400 | 5 | 80 | 3.60% | 101gf | 1.10E+08 |
| 8 | 400 | 80 | 800 | 5 | 160 | 3.50% | 110gf | 1.20E+08 |
| 9 | Base layer without an opening | | | | | | 7342gf | 8.00E+09 |

FIG. 5

DISPLAY SUBSTRATE AND DISPLAY DEVICE IN WHICH DIFFERENCE IN DEFORMATION BETWEEN CENTRAL AND PERIPHERAL PORTIONS OF DISPLAY REGION IS ELIMINATED DURING STRETCH OR COMPRESSION

CROSS REFERENCE TO RELATED APPLICATIONS

This is a National Phase Application filed under 35 U.S.C. 371 as a national stage of PCT/CN2019/122392, filed Dec. 2, 2019, an application claiming the benefit of Chinese patent application No. 201811465167.X, filed on Dec. 3, 2018, the entire contents of each of which are incorporated herein in their entirety by reference.

TECHNICAL FIELD

The present disclosure relates to the field of display technologies, and particularly relates to a display substrate and a display device.

BACKGROUND

With the development of technologies, research on stretchable display devices has been carried out. Each stretchable display device generally includes a display substrate including a stretchable base layer having an opening, and a plurality of display elements are disposed on the base layer other than a portion where the opening is located. When the display substrate is stretched or compressed, degrees of deformation (i.e., amounts of deformation) generated by various portions of the display substrate may be different, resulting in different distances between adjacent display elements on various portions of the base layer, which may cause degradation of the display effect of a display panel. Therefore, it is desirable to provide a display substrate and a display device that have an excellent display effect even when being stretched or compressed.

SUMMARY

An aspect of the present disclosure provides a display substrate, which includes a base layer that includes at least a display region, wherein the display region includes a plurality of opening regions, each of the plurality of opening regions includes a plurality of islands spaced apart from each other by a plurality of openings and connected to each other by a plurality of bridges, and at least two of the plurality of opening regions have different elastic moduli.

In an embodiment, the plurality of opening regions have different elastic moduli.

In an embodiment, the plurality of opening regions include a first opening region and a second opening region that are arranged alternately, the first opening region has a first elastic modulus, the second opening region has a second elastic modulus, and the first elastic modulus is not equal to the second elastic modulus.

In an embodiment, each of the plurality of openings is a rectangle, each of the plurality of bridges is a rectangle, and each of the plurality of islands is a rectangle.

In an embodiment, in adjacent two of the plurality of opening regions, the islands have a same size, and the bridges between adjacent ones of the islands have different lengths.

In an embodiment, in adjacent two of the plurality of opening regions, the islands have different sizes, and the bridges between adjacent ones of the islands have different lengths.

In an embodiment, in the opening regions having a same elastic modulus, the islands have a same size, and the bridges between adjacent ones of the islands have a same length.

In an embodiment, in adjacent two of the plurality of opening regions, an area of each opening of the opening region having a larger elastic modulus is smaller than an area of each opening of the opening region having a smaller elastic modulus.

In an embodiment, each island is defined by four openings of the plurality of openings and four bridges of the plurality of bridges, and each of the four bridges is at one end of a respective one of the four openings and at four corners of the island.

In an embodiment, a width of each bridge is equal to a width of the opening at one end of which the bridge is located and less than a width of the island adjacent to the bridge, and a length of the bridge is at least a width of one wire.

In an embodiment, the base layer further includes non-display regions at both sides of the display region, respectively, each non-display region includes a transition region adjacent to the display region, and an elastic modulus of the transition region is greater than that of the display region and less than that of other region of the non-display region other than the transition region.

In an embodiment, the elastic modulus of the transition region gradually increases in a direction from the display region to the other region of the non-display region.

In an embodiment, the transition region includes a plurality of auxiliary islands spaced apart from each other by a plurality of auxiliary openings and connected to each other by a plurality of auxiliary bridges, and a distance between adjacent two of the auxiliary islands is different from a distance between adjacent two of the islands.

In an embodiment, a shape of each of the auxiliary islands is the same as a shape of each of the islands.

In an embodiment, each of two outermost opening regions respectively at two opposite sides of the plurality of opening regions is the second opening region, and the second elastic modulus is less than the first elastic modulus.

In an embodiment, the second elastic modulus is 70% to 99% of the first elastic modulus.

In an embodiment, the display substrate further includes an auxiliary film on each transition region, wherein the auxiliary film has a thickness increasing in a direction from the display region to the other region of the non-display region including the transition region.

In an embodiment, a material of the auxiliary film includes at least one of silicon nitride, silicon oxide, polyimide, and a metal of titanium.

An aspect of the present disclosure provides a display device, which includes:
the display substrate according to any one of the foregoing embodiments of the present disclosure;
light emitting devices on at least a portion of the plurality of islands, respectively; and
wires respectively on at least a portion of the plurality of bridges for connection to the light emitting devices.

BRIEF DESCRIPTION OF THE DRAWINGS

FIG. 5 is a schematic diagram showing stress test results for a display substrate including an island, a bridge, and an opening that have different parameters, according to an embodiment of the present disclosure;

DETAILED DESCRIPTION

Figure 1A:
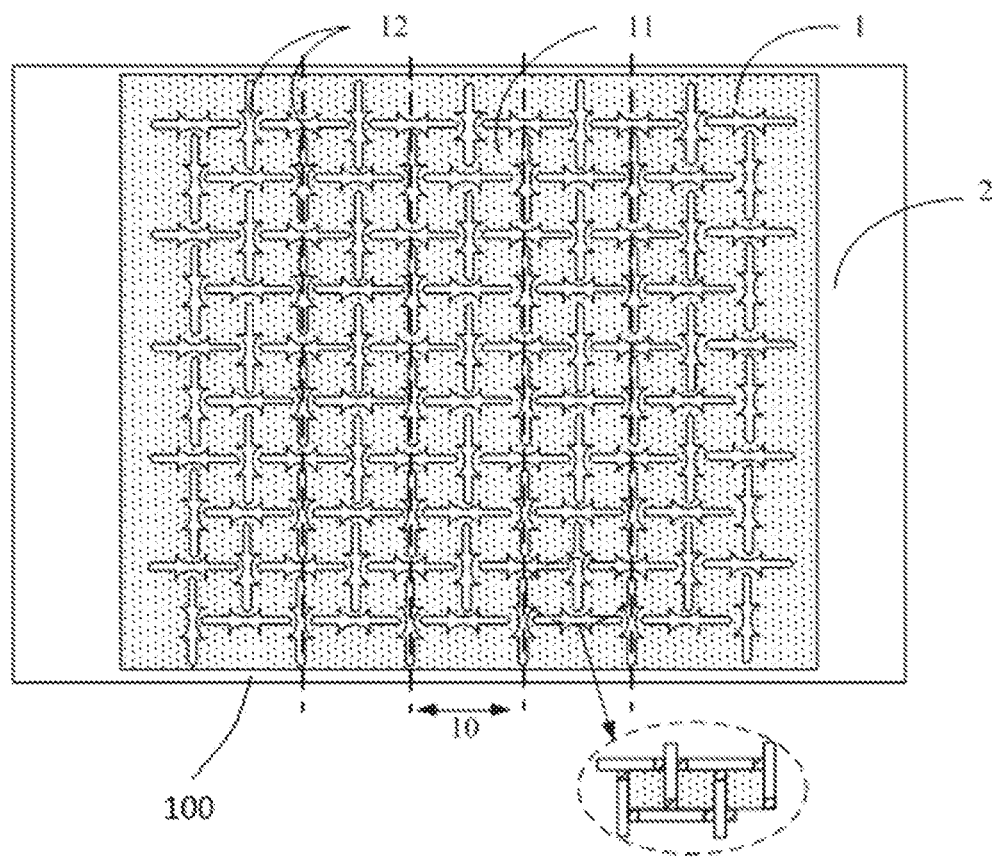
FIGS. 1A and 1B are schematic diagram showing structures of display substrate according to some embodiments of the present disclosure.

To enable one of ordinary skill in the art to better understand technical solutions of the present disclosure, a display substrate and a display device provided by the present disclosure will be described in further detail below with reference to the accompanying drawings and exemplary embodiments.

The inventors of the present inventive concept found that, in a case where openings in respective portions of a display region of a base layer of a display substrate have a same shape and a same size, a nonuniform distribution of force transmission may occur at the openings during the display substrate or the base layer of the display substrate being stretched, resulting in different degrees of deformation at different openings, i.e., resulting in a nonuniform deformation. In a central portion of the display region, an amount of deformation of each opening is large, and thus a distance between light emitting devices disposed between respective openings may be large. In a peripheral portion of the display region, an amount of deformation of each opening is small, and thus a distance between light emitting devices disposed between respective openings is smaller than that in the central portion. Experiments have shown that an amount of deformation of a point with the maximum deformation may be about 2 times of an amount of deformation of a point with the minimum deformation, and such a nonuniform deformation causes different distances between pixels respectively corresponding to the light emitting devices, thereby degrading a display effect.

Further, in a case where the base layer of the display substrate includes a material of polyimide (PI), the inventors of the present inventive concept have found through studies that, an elastic modulus of the base layer after being provided with the openings is about $\frac{1}{100}$ of an elastic modulus of the base layer without an opening, and the cause for the difference in the distance between pixels in opening regions of the display region is a difference in the amounts of deformation of different opening regions, i.e., the amount of deformation in the central portion of the display region is larger than that in the peripheral portion. The reason for this is that accumulative deformation occurs in the central portion of the display region, thereby causing the distance between pixels of the central portion to be larger than the distance between pixels of the peripheral portion.

Therefore, it is a technical problem to be solved urgently at present to reduce the difference between the distances between the pixels during the display substrate or the base layer of the display substrate being stretched to ensure the desired display effect.

At least in view of the above technical problems, a technical idea of the present inventive concept lies in the principle that, the deformation of the whole base layer is mainly borne by the deformation of bridges according to a structural relationship among islands, the bridges, and openings, or lies in the island-bridge relationship principle that the deformation is affected by a layout of the openings. Different island-bridge structures may be obtained in different regions by forming different openings in the different regions, such that the elastic moduli of the whole base layer in different regions are different, thereby reducing stress concentration.

Embodiments of the present disclosure provide a display substrate, which can effectively solve at least the problem of display difference (or degradation in the display effect) of a display region caused by nonuniform deformation of openings.

Figure 2:
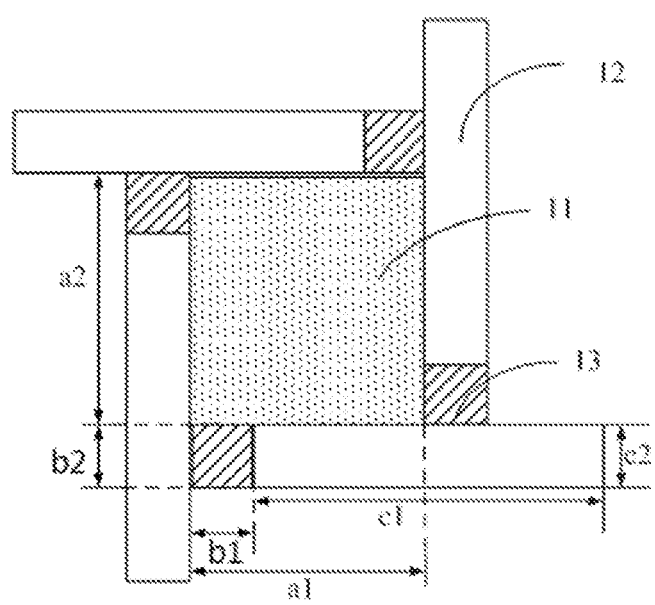
FIG. 2 is a schematic diagram showing structures of one of islands, openings surrounding the island, and bridges surrounding the island as shown in FIG. 1A.

As shown in FIGS. 1A and 2, the display substrate according to the present embodiment includes a base layer 100, and the base layer 100 includes at least a display region 1. The display region 1 includes a plurality of opening regions 10, and each of the plurality of opening regions 10 includes a plurality of islands 11 spaced apart from each other by a plurality of openings 12 and connected to each other by a plurality of bridges 13. For example, at least two of the plurality of opening regions 10 have different elastic moduli (e.g., Young's moduli). By dividing the display region 1 of the base layer 100 into different regions (e.g., the opening regions 10) and adjusting the elastic moduli of different regions, respectively, the accumulative deformation of a central portion of the display region 1 is reduced, and a difference in deformation between the central portion and a peripheral portion of the display region is eliminated. As a result, the display effect of the display substrate is improved, for example, during the display substrate being stretched or compressed.

When the display region 1 is divided, the base layer 100 may be divided into different opening regions 10 in the display region 1, along a certain direction of an arrangement of pixels (e.g., in either one of a horizontal direction (e.g., a row direction of the pixels), an a vertical direction (e.g., a column direction of the pixels), or in both of the horizontal direction and the vertical direction), and the opening regions 10 of the base layer 100 have different elastic moduli. That is, a unidirectional division or a bi-directional division may be realized, and then the elastic moduli of different divided regions are adjusted such that according to a stress direction, a stretching stress may be buffered. The present embodiment is exemplified by a division along the horizontal direction (e.g., the horizontal direction in FIG. 1A) according to an application scenario of the display substrate. In other words, as shown in FIG. 1A, the display region 1 of the base layer 100 is divided into the plurality of opening regions 10, the plurality of opening regions 10 are arranged in the horizontal direction, and each of the plurality of opening regions 10 extends in the vertical direction.

In an example, different regions of the base layer 100 are provided with different openings to achieve an alternating distribution of elastic moduli, thereby reducing a difference in deformation of the base layer 100 in the different regions after the base layer 100 is stretched. In the opening regions 10 having different elastic moduli, the openings of the respective opening regions 10 may have different sizes, and an area of each opening of the opening region 10 having a larger elastic modulus is smaller than an area of each opening of the opening region 10 having a smaller elastic modulus.

In the display substrate of the present embodiment, different portions of the display region 1 have different openings, such that different island-bridge structures may be obtained at the different portions, and the elastic moduli of the overall structure of the base layer 100 in different regions are different, thereby reducing the difference in the distances between the pixels and avoiding the degradation in the display effect.

Figure 3:
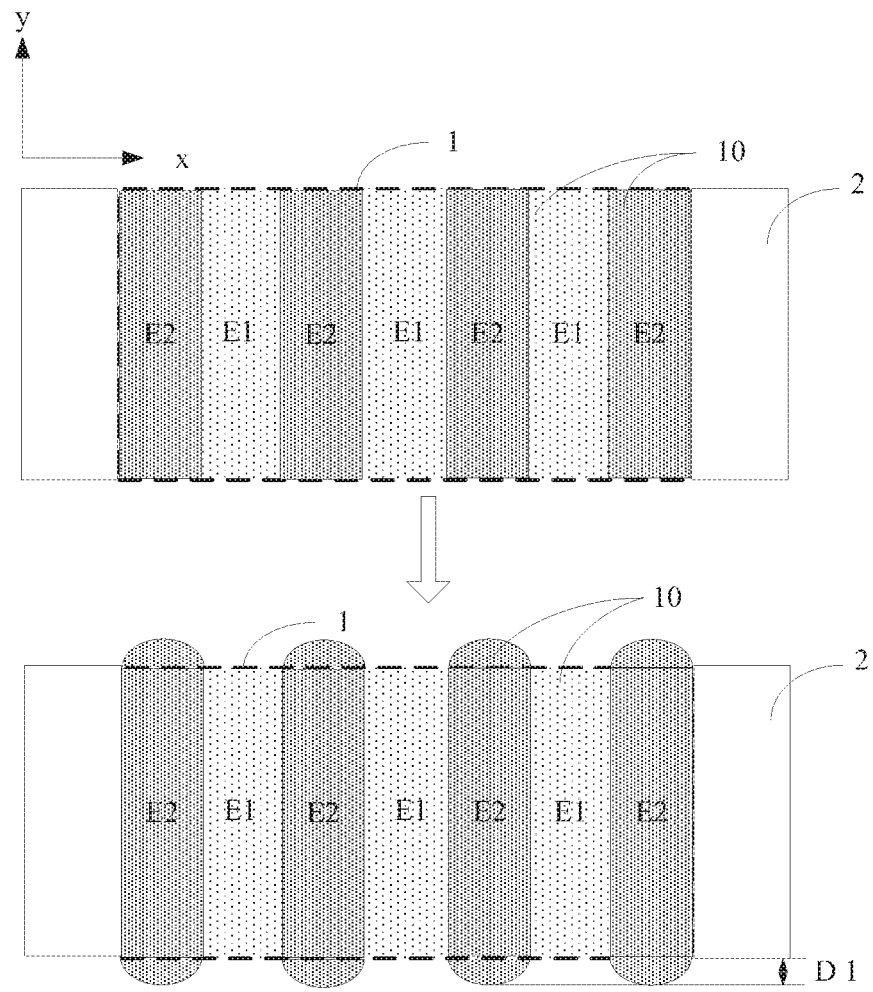
FIG. 3 is a schematic diagram showing opening regions, which have different elastic moduli, of a base layer and deformation of the opening regions, according to an embodiment of the present disclosure.
Figure 4:
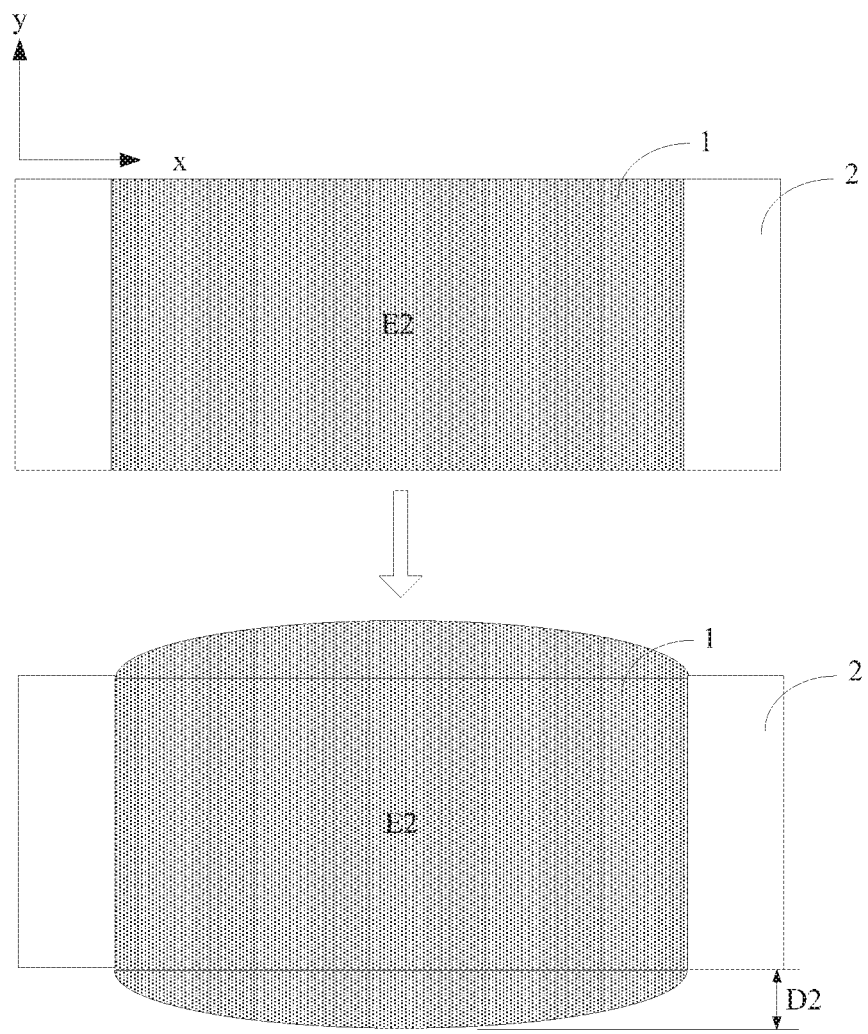
FIG. 4 is a schematic diagram showing an opening region, which has a single elastic modulus, and deformation of the opening region.

In general, since peripheral structures of the display region 1 may vary (e.g., the peripheral structures in the up-down direction are different from the peripheral structures in the left-right direction in FIG. 1A), a stretched deformation or a compressed deformation may be various in two directions perpendicular to each other (e.g., the horizontal direction X and the vertical direction Y shown in FIG. 3 or 4). As shown in FIG. 1A, the base layer 100 may further include two non-display regions 2 respectively located at two opposite sides of the display region 1. As described above, the display region 1 of the base layer 100 is divided into the plurality of opening regions 10, and different opening regions 10 have different elastic moduli.

In FIG. 1A, each of the opening regions 10 is formed with a plurality of openings 12, and arrangement directions of the openings 12 in different opening regions 10 may be the same. The plurality of opening regions 10 of the base layer 100 may include a first opening region having a first elastic modulus $E_1$ and a second opening region having a second elastic modulus $E_2$ that are alternately arranged (see FIG. 3), and the first elastic modulus $E_1$ is not equal to the second elastic modulus $E_2$. That is, regions having a larger elastic modulus are on both sides of each region having a smaller elastic modulus, and regions having a smaller elastic modulus are on both sides of each region having a larger elastic modulus. Such an alternating arrangement of different regions may result in a good effect of equalizing the amounts of deformation in the different regions (e.g., the opening regions 10) of the display region 1.

For example, the structures of islands 11, the openings 12 and bridges 13 may have different shapes. For example, the shape of each opening 12 in FIG. 1A may be a rectangle, and the shape of each opening 12 in FIG. 1B may be a cross. An enlarged view of three islands 11 and associated openings 12 and bridges 13 is shown within the lower dashed oval in FIG. 1A, and FIG. 2 shows the structures of each island 11 and associated openings 12 and bridges 13 in FIG. 1A, with each opening 12 being a rectangle as an example. In an example, the openings 12 are provided in the row direction and the column direction of the display region 1 alternately to be perpendicular to each other, each opening 12 contacts two corresponding adjacent islands 11 in a length direction of the opening 12, and a bridge 13 connected to an island 11 is formed at an end of each opening 12. A width $c_2$ of each opening 12 is equal to a width $b_2$ of each bridge 13, and a length $c_1$ of each opening 12 is equal to a sum of a distance between two adjacent openings 12 in a width direction of the opening 12 and the width of two bridges 13. For example, as shown in FIGS. 1A and 2, each of the openings 12 may be a rectangle, each of the bridges 13 may be a rectangle, and each of the islands 11 may be a rectangle. Further, each of the islands 11 may be defined by four of the plurality of openings 12 and four of the plurality of bridges 13, and the four bridges 13 are respectively located at ends of the four openings 12 and respectively located at four corners of the island 11. With the above arrangement and structures of each island 11, the bridges 13 and the openings 12, the base layer 100 may form a continuous base layer with hollowed-out regions (i.e., the openings 12) by the islands 11 and the bridges 13.

FIG. 2 shows an example in which the structure of each island 11, each opening 12 or each bridge 13 is a rectangle. Each island 11 may have a length $a_1$ and a width $a_2$ that are equal to each other, and a size of each island 11 may be determined by a size of a pixel (e.g., a light emitting device) disposed on the island 11. The size of each island 11 is generally larger than the size of the pixel located on the island 11, taking into account the actual requirements for wirings. A length $b_1$ of each bridge 13 may be determined according to the number of wires for the light emitting device disposed on a corresponding island and a width of each wire. In a case of a given width of each wire, the length $b_1$ of each bridge 13 is great when the number of the wires is large, and the length $b_1$ of each bridge 13 is small when the number of the wires is small. The width $b_2$ of each bridge 13 is the same as the width $c_2$ of each opening 12 (i.e., $b_2=c_2$), and each bridge 13 connects the islands 11 adjacent to the bridge 13 to each other. The amounts of deformation vary for different sizes of the openings 12 under a same stretching force, and the stretchable properties of the base layer 100 and the display substrate may be changed by changing the sizes of the islands 11 and the bridges 13. On the other hand, since the islands 11 and the bridges 13 are the remaining portions of the base layer 100 after the openings 12 are formed in the base layer 100, the size of each island 11 and the size of each bridge 13 may be considered to be dependent on the size of each opening 12 to a certain extent. Therefore, it is possible to realize a configuration in which different regions have different elastic moduli by adjusting the size of each opening 12 while ensuring that the size of each island 11 is unchanged. In the case where the display regions 1 have the same area, when a region where the width $c_2$ of each opening 12 is small (i.e., the distance between adjacent islands 11 is small) and the length $c_1$ of the opening 12 is small (i.e., the size of each island 11 is small to a certain extent) is compared with a region where the width $c_2$ of each opening 12 is large (i.e., the distance between adjacent islands 11 is large) and the length $c_1$ of the opening 12 is large (i.e., the size of each island 11 is large to a certain extent), the former may have a greater distribution density of islands and a greater elastic modulus than the latter. It should be noted that the term "length" used here may refer to a size (or dimension) of a corresponding component in the horizontal direction (i.e., in the row direction of the pixels) in FIGS. 2 and 8, and the term "width" used here may refer to a size of the corresponding component in the vertical direction (i.e., in the column direction of the pixels) in FIGS. 2 and 8. It is also to be noted that, regarding the sizes of each opening 12 and each bridge 13 (or an auxiliary opening 22 and an auxiliary bridge 23 to be described below), although the lowermost opening 12 and the lowermost bridge 13 in FIG. 2 (or the lowermost auxiliary opening 22 and the lowermost auxiliary bridge 23 in FIG. 8) are described as an example, the four openings 12 and the four bridges 13 in FIG. 2 (or the four auxiliary openings 22 and the four auxiliary bridges 23 in FIG. 8) have the same size, respectively.

Figure 1B:
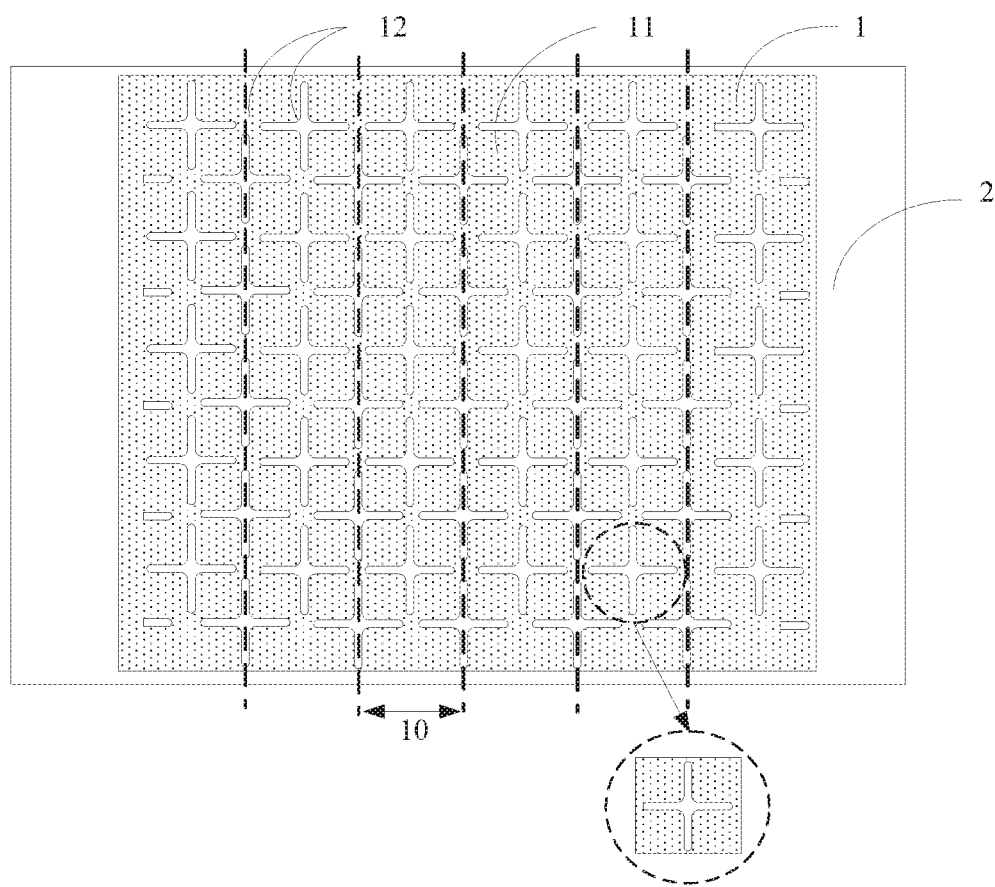

Further, referring to FIGS. 1A, 1B and 2, in each of the opening regions 10, the size of each island 11 may be determined by the relative position between two adjacent openings 12. Specifically, the length a1 of each island 11 is determined, for example, by the relative position between two adjacent openings 12 arranged in the horizontal direction, and the width a2 of each island 11 may be determined, for example, by the relative position between two adjacent openings 12 arranged in the vertical direction. The length a1 and the width a2 of each island 11 may be equal to each other, i.e., each island 11 may be a square in the plan view shown in FIG. 2. The length b1 of each bridge 13 may be determined by the relative position between two adjacent openings 12 arranged perpendicular to each other, and the width b2 of each bridge 13 may be determined by the width c2 of a corresponding opening 12. Therefore, in a case of not changing the size of each opening 12, the size of a corresponding island 11 and the length b1 of a corresponding bridge 13 may be changed by changing a position where the opening 12 is provided, and it is possible to obtain a matching structure for the island 11 and the bridge 13 and to obtain the desired elastic modulus. Alternatively, it is possible to obtain the matching structure for the island 11 and the bridge 13 and to obtain the desired elastic modulus by adjusting both the size and the position of the opening 12.

The plurality of opening regions 10 may include the first opening region and the second opening region that are arranged alternately, the first opening region has the first elastic modulus, the second opening region has the second elastic modulus, and the first elastic modulus may not be equal to the second elastic modulus. In this case, the display region 1 of the base layer 100 may be divided in the horizontal direction X to limit the deformation of the base layer 100 in the vertical direction Y, for the case where non-display regions 2 are respectively provided on the left side and the right side of the base layer 100. In FIG. 3, reference signs E1 and E2 may also indicate that the opening regions 10 respectively having two different elastic moduli E1 and E2 are arranged alternately. For example, the alternating arrangement of the opening regions 10 may be such that the elastic moduli of the regions at both ends are different, such as in the form of E1-E2-E1-E2 or E2-E1-E2-E1; or may be such that the elastic moduli of the regions at both ends are equal to each other, such as in the form of E1-E2-E1-E2-E1 or E2-E1-E2-E1-E2. The present embodiment is exemplified as being in the form of E2-E1-E2-E1-E2, as shown in FIG. 3.

In an embodiment, in two adjacent opening regions 10 of the base layer 100 that have different elastic moduli E1 and E2 (e.g., adjacent regions E1 and E2 as shown in FIG. 3), the islands 11 may have the same size (alternatively, the islands 11 may have different sizes), and the bridges 13 between adjacent islands 11 may have different widths b2. In the opening regions 10 having the same elastic modulus, for example, in the regions indicated by E1 in FIG. 3, the islands 11 may have the same size, and the bridges 13 between adjacent islands 11 may have the same width b2; or in the regions indicated by E2 in FIG. 3, the islands 11 may have the same size, and the bridges 13 between adjacent islands 11 may have the same width b2. Because the islands 11 have the same size, patterns of portions, in which the islands 11 and the bridges 13 are provided, of the base layer 100 at a boundary (junction) between different regions match to each other better, and the problem of stress concentration at the boundary may be avoided effectively.

When the openings 12 of various sizes or the openings 12 of a single size are provided in a local region of the base layer 100, the base layer 100 may expand outward or shrink inward after being subjected to a force, depending on different shapes of openings. For example, as shown in FIGS. 3 and 4, which show a phenomenon that the base layer 100 expands outward in the vertical direction Y. In this case, each opening 12 provided in the base layer 100 may have a rectangular structure (or a rectangular shape) as shown in FIG. 1A. On the other hand, in a case where the base layer 100 shrinks inward in the vertical direction Y, each opening 12 provided in the base layer 100 may have a cross-shaped structure (or a cross shape) as shown in FIG. 1B, for example.

In the display substrate with the plurality of opening regions 10 having different elastic moduli as shown in FIG. 3, the elastic modulus of each region E1 is greater than that of each region E2 (i.e., E1>E2) under a same stretching condition. Under a same stress, the amount of deformation of each region E2, which has a small elastic modulus, of the base layer 100 is larger, but the region E2 is not responsible for all amount of deformation, and the regions E1, which have a large elastic modulus, at both sides of the region E2 are also responsible for a part of the amount of deformation, such that the whole amount of deformation of the base layer 100 is relatively small. It can be seen that appropriately different elastic moduli enables the amount of deformation to be distributed in each region E1 and each region E2 and enables deformation to be alternately changed between the adjacent regions E1 and regions E2, such that the difference in deformation of the display substrate after being stretched may be effectively reduced. In order to avoid stress concentration, the difference between the elastic moduli E1 and E2 may not be too large, for example, E2 may be equal to or greater than 70% of E1 and equal to or less than 99% of E1, i.e., E2=(70%-99%) E1.

FIG. 3 shows that the maximum deformation occurs in the regions E2 having a smaller elastic modulus and the maximum amount of deformation is D1, after the display substrate is stretched. FIG. 4 shows that the display region 1 of the base layer 100 of the display substrate is provided with a single opening 12, and this case is equivalent to that the entire display region 1 of the base layer 100 has the elastic modulus E2. The simulation result of FIG. 4 shows that the degree of expanding outward in the central portion of the display region 1 is greater than the degree of expanding outward in the peripheral portion of the display region 1, and the maximum amount of deformation is D2. The results of testing on samples also show that D2>D1. Comparing FIG. 3 with FIG. 4, it can be seen that the design of the plurality of opening regions 10 having different elastic moduli may result in a reduction in the maximum amount of deformation of the base layer 100.

In an example, the width b2 of each bridge 13 is equal to the width c2 of a corresponding opening 12, the width a2 of a corresponding island 11 is greater than the length b1 of the bridge 13, and the length b1 of the bridge 13 is at least the width of one wire, e.g., the length b1 of the bridge 13 may be between 1 μm to 10 μm. When the number of the wires is two or more, the wires may be arranged in parallel in a plane on the bridge 13, and in this case the width of the bridge is at least the sum of the widths of the wires. Alternatively, the wires may be stacked on the bridge 13 sequentially, and in this case the width of the bridge may be slightly larger than the width of one wire.

Referring to the test results of the island-bridge two-dimensional simulation structure shown in FIG. 5, when a ratio of the width of each island 11 to the length of a corresponding bridge 13 ranges from 5 to 20, an overall amount of deformation of each of display substrate samples under a same stretching force are measured, and the elastic moduli are calculated in a case where stretching forces are applied to the display substrate samples to cause a same overall amount of deformation (e.g., 3%), under different parameters of each island 11, a corresponding bridge 13, and a corresponding opening 12. The test results show that: under a same stress, a smaller ratio of the width of the island 11 to the length of the bridge 13 results in a smaller overall amount of deformation; and as the ratio of the width of the island 11 to the length of the bridge 13 increases, the overall amount of deformation under the same stress gradually increases. According to the test results of FIG. 5, a reference may be provided for elastic modulus configurations of the island-bridge structures of the display region 1 at different regions. It should be noted that the units of the length and the width in FIG. 5 are both micron (μm).

It can be seen that the design for the different opening regions 10 of the display region 1 provided by the embodiments of the present disclosure achieves an alternating distribution of elastic moduli by designing the different openings 12. During the stretching of the display region 1, the regions with a smaller elastic modulus are deformed first, such that each region with the smaller elastic modulus is largely deformed, and the regions with a larger elastic modulus at both sides of the region with the smaller elastic modulus may limit the deformation to a certain degree. Therefore, by such a design of the alternating distribution of elastic moduli, it is possible to distribute the overall amount of expanding outward of the base layer 100 to each of the regions having different elastic moduli, thereby achieving the effect of reducing the difference in deformation of the display region 1 (or the base layer 100 or the display substrate) after being stretched. Such a design of the alternating distribution of elastic moduli is also applicable to the case where an amount of shrinking inward of the entire base layer is distributed to each of the regions having different elastic moduli after the base layer is stretched or compressed.

The display substrate may be formed by removing the portions of the entire layer structure of the base layer 100 corresponding to the portions where the openings 12 are to be formed. Specifically, the entire layer structure for the base layer 100 may be placed on glass first, a pattern is then defined by a patterning process that uses yellow light for exposing the entire layer structure for the base layer 100, and next, the openings 12 are formed in the entire layer structure by developing and etching, thereby forming a continuous and hollowed-out base layer 100.

The display substrate of the above embodiments may have a distribution of elastic moduli that changes alternately and periodically through the structure of the openings, and may reduce the difference in amount of deformation between different opening regions. As such, the problem that stress is concentrated in an opening region with a single elastic modulus after the display region of the display substrate is stretched or compressed may be solved, and a uniform distance between the pixels is ensured. Therefore, the problem that the display effect is degraded due to different distances between the light emitting devices caused by nonuniform stretching deformation or nonuniform compression deformation of the display substrate is solved.

The above embodiments compensate for the nonuniform deformation by the openings such that the amounts of deformation in different parts of the display region are the same or substantially the same. On the basis of the above embodiments, the display substrate according to some other embodiments of the present disclosure further adopts pixel compensation on the basis of the compensation by the openings. A pre-compensation is applied before the base layer 100 is stretched by setting different distances between the pixels, so as to reduce the difference in distance between the pixels on the base layer 100 after the base layer 100 is stretched, thereby solving the problem of degradation of the display effect caused by different distances between the pixels.

If the width of each opening in each region E1 and the width of each opening in each region E2 are different, the distances between adjacent islands 11 may be different before the display region 1 is stretched, and the amounts of deformation of the openings 12 after the display region 1 is stretched may be different. Thus, the distances between the pixels may become the same by a proper design after the display region 1 is stretched. In practical applications, when the pixel compensation is performed for the above case, the deformation resulted from both the elastic moduli of the opening regions and the initial distances between the pixels should be taken into consideration.

Figure 6:
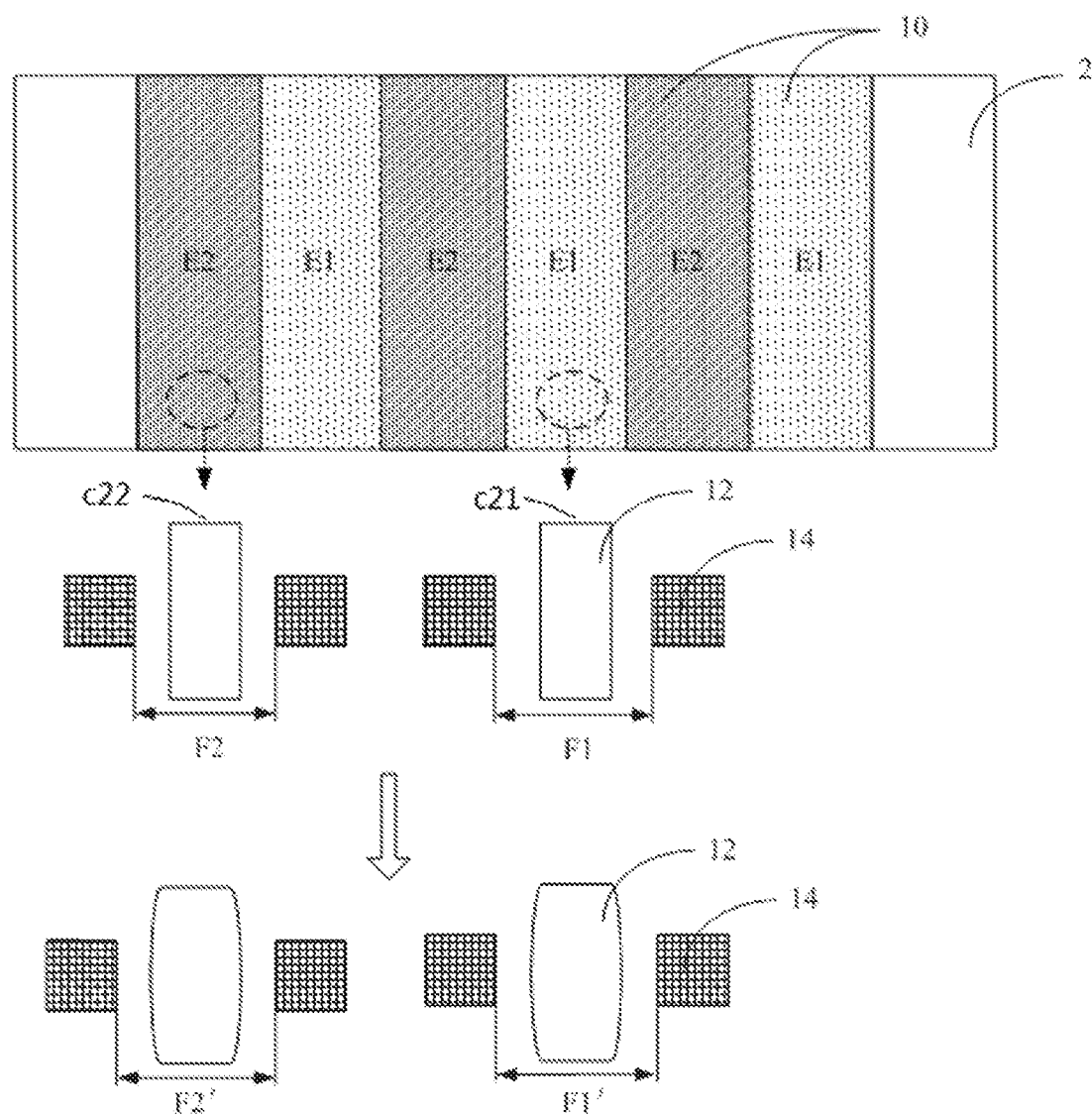
FIG. 6 is a schematic diagram showing opening regions, which have different elastic moduli, of a base layer and deformation of the opening regions, according to an embodiment of the present disclosure.

In an embodiment as shown in FIG. 6, in the opening regions 10 (i.e., the regions E1 and the regions E2) of the display region 1 of the base layer 100 that have different elastic moduli, the islands 11 may have different sizes (although the islands 11 may have the same size), and the bridges 13 between adjacent islands 11 may have different widths b2. Alternatively, in the opening regions 10 (i.e., the regions E1 and the regions E2) of the display region 1 of the base layer 100 that have different elastic moduli, the islands 11 may have the same size, and the bridges 13 between adjacent islands 11 may have the same width b2. It should be understood here that since an area of the pixel on each island 11 is often smaller than an area of the island 11, in order to more intuitively illustrate the effect of pixel compensation, FIG. 6 illustrates the pixels 14 to be formed instead of the islands 11. In FIG. 6, each of reference signs F1 and F2 represents the distance between two adjacent pixels 14 before a force is applied, and each of reference signs F1' and F2' represents the distance between the two adjacent pixels 14 after a force is applied.

In the display substrate having the plurality of opening regions 10 with different elastic moduli shown in FIG. 6, the elastic modulus of each region E1 is greater than that of each region E2 (i.e., E1>E2), and the sizes of the openings 12 in the opening regions 10 with different elastic moduli are different (specifically, the width c21 of each opening 12 in the regions E1 is greater than the width c22 of each opening 12 of the regions E2). The openings 12 in the regions E1 allow for the distance F1 between adjacent pixels 14, and the openings 12 in the regions E2 allow for the distance F2 between adjacent pixels 14, where F1>F2. Each region E2 having a small elastic modulus is preferentially deformed and the amount of deformation thereof is large during the stretching of the display region 1, while the amount of deformation of each region E1 having a large elastic modulus is small. After the stretching of the display region 1 is finished, the original distance F1 between the adjacent pixels 14 is deformed to be the distance F1', and the original distance F2 between the adjacent pixels 14 is deformed to be the distance F2'. Since E1>E2, the amount of deformation of each region E1 is smaller than that of each region E2, i.e., $\Delta F1<\Delta F2$. Further, since F1>F2, it is possible to realize F1'=F2' finally.

It can be seen that a pre-compensation for the pixel positions in each region with a smaller elastic modulus may be provided during designing the pixel (e.g. light emitting device) positions, such that the distance between the pixels in each region E1 is greater than the distance between the pixels in each region E2, i.e., the distance between islands 11 in each region with a larger elastic modulus is greater than the distance between islands 11 in each region with the smaller elastic modulus. Thus, the pre-compensation is offset by the phenomenon that a change in distance between the islands 11 in each region with the larger elastic modulus is smaller and a change in distance between the islands 11 in each region with the smaller elastic modulus is larger during the stretching of the base layer 100. As a result, the distances between the islands 11 of the regions having different elastic moduli become equal to each other or close to each other after the base layer 100 is stretched, thereby reducing the difference in distances between the pixels.

It can be seen that, in the display region 1 of the base layer 100 of the display substrate having the plurality of opening regions 10 with different elastic moduli, according to the size of each opening 12 and by utilizing the phenomenon that the deformation of each opening 12 is different due to the difference between the elastic moduli, the pixel compensation may be made on a basis of a structural compensation, such that the difference in deformation of the display substrate after being stretched may be effectively reduced, thereby avoiding the difference in distance between the pixels more effectively, and improving the display effect of the display substrate after being stretched.

In summary, the pixel compensation for the display substrate according to the present embodiment is made based on the principle that the distances between the pixels before the display substrate is stretched are different and the distances between the pixels after the display substrate is stretched become the same. The difference in distance between adjacent islands and the difference in elastic modulus between different regions may be determined by the sizes of the openings in the different regions, and these differences may be used for compensating the difference in deformation of the openings after the display substrate is stretched, such that the sizes of the openings after the display substrate is stretched become to be equal to each other, thus equalizing the distances between the pixels.

The alternating distribution of the elastic moduli of the opening regions of the display substrate in the embodiments shown in FIGS. 1A to 6 may be achieved by changing the sizes of the islands, changing the sizes of the openings, and the like. The alternating distribution of the elastic moduli and the different amounts of deformation of the openings with different sizes may effectively reduce the difference in deformation between the central portion and the peripheral portion of the display region, and effectively solve the problem that the display effect is degraded due to nonuniform deformation of the display substrate after being stretched, thereby improving the display effect of the display substrate after being stretched.

In addition, the inventors of the inventive concept also found in practical experiments that, at a boundary (or junction) between the display region 1 and a non-display region, since the non-display region does not include an opening generally, the elastic modulus of the display region is different from the elastic modulus of each of the non-display regions located at both sides of the display region, and a difference therebetween is excessively large. As a result, the boundary between the display region 1 and each of the non-display regions of the base layer 100 is subjected to stress concentration during a stretching process, and thus the base layer is easily fractured. To solve the above problem, another embodiment of the present disclosure provides a display substrate. Compared with the display substrate according to any one of the embodiments shown in FIGS. 1A to 6, the display substrate according to the present embodiment may further effectively solve the problem that a fracture easily occurs at the boundary between the display region 1 and each of the non-display regions.

Figure 7:
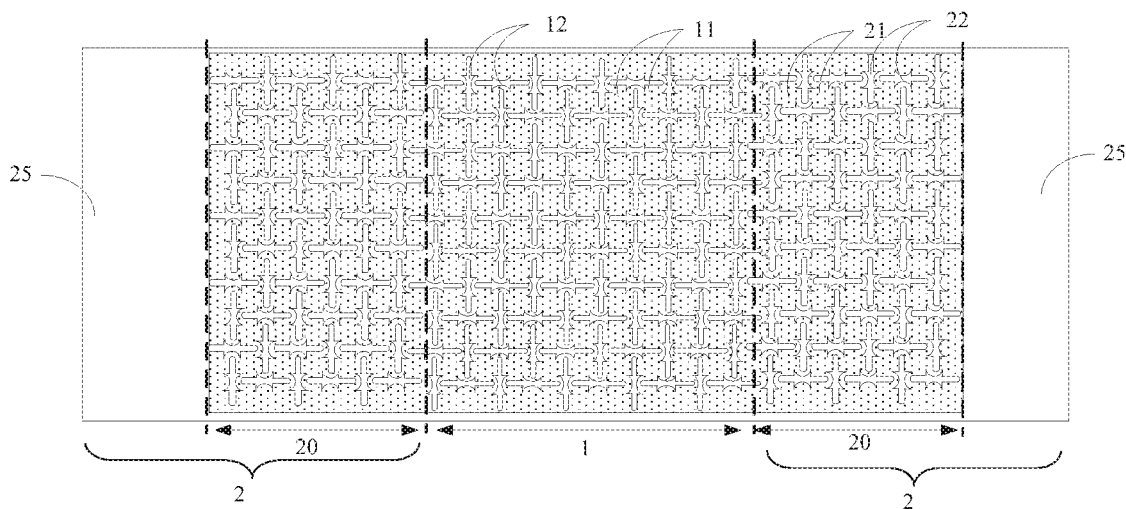
FIG. 7 is a schematic diagram showing a structure of a display substrate according to an embodiment of the present disclosure.

Referring to FIG. 7, the base layer 100 of the display substrate according to the present embodiment includes the display region 1 and non-display regions 2 respectively located at both sides of the display region 1. The display region 1 and each of the non-display regions 2 have different deformation capacities, and a difference in elastic modulus between the display region 1 and each of the non-display regions 2 is relatively large, which results in that the structure at the boundary between the display region 1 and each of the non-display regions 2 is prone to fracture due to stress concentration. Thus, in the present embodiment, the elastic modulus of a portion of each non-display region 2 adjacent to the display region 1 is adjusted, and the portion of each non-display region 2 adjacent to the display region 1 is set as a transition region 20 (which may be considered to be a dummy region). The elastic modulus of each transition region 20 (i.e., the portion of the base layer 100 in the transition region 20) is larger than the elastic modulus of the display region 1 and smaller than the elastic modulus of the other region (hereinafter referred to as a non-opening region 25) of each non-display region 2 than the transition region.

In an example, each of the non-display regions 2 at both sides of the base layer 100 includes the non-opening region 25 and the transition region 20 located between the display region 1 and the non-opening region 25. The elastic modulus of each transition region 20 increases gradually in a direction from the display region 1 to the non-opening region 25, thereby the stress at the boundary may be distributed throughout the transition region 20. In the display substrate according to the present embodiment, the display region 1, the transition region 20 of each non-display region 2, and each non-opening region 25 have different elastic moduli.

In the display substrate according to the present embodiment, by changing the structure at the boundary between the display region 1 and each non-display region 2, the elastic modulus of the structure (i.e., the transition region 20) of the display substrate from the non-opening region 25 of each non-display region 2 to the display region 1 is uniformly decreased, thereby solving the problem of stress concentration of the display substrate at the boundary between the display region 1 and each of the non-display regions 2.

As another embodiment of the present disclosure, in order to solve the problem that the boundary between the display region 1 and each of the non-display regions 2 is easily fractured, similar to the opening regions 10 provided in the display region 1, auxiliary openings 22 may be provided in the transition region 20 of each of the non-display regions 2 to adjust the elastic modulus of the transition region 20 of the base layer 100, as shown in FIG. 7.

Figure 8:
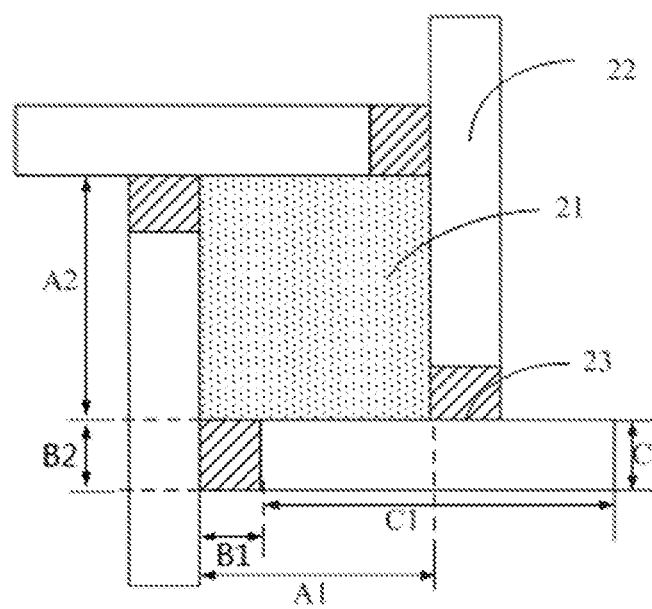
FIG. 8 is a schematic diagram showing structures of one of auxiliary islands, auxiliary openings surrounding the auxiliary island, and auxiliary bridges surrounding the auxiliary island of the display substrate as shown in FIG. 7.

In an implementation, on the basis of the embodiment shown in FIG. 7, a plurality of auxiliary openings 22 may be provided in each transition region 20, and the plurality of auxiliary openings 22 allow the corresponding transition region 20 to include a plurality of auxiliary islands 21 spaced apart from each other by respective auxiliary openings 22 and connected to each other by respective auxiliary bridges 23, and a distance between adjacent auxiliary islands 21 may be different from the distance between adjacent islands 11 in the display region 1, as shown in FIG. 8.

In an example, each auxiliary island 21 may be similar to each island 11, i.e., a pattern of each auxiliary island 21 and a pattern of each island 11 may have a same shape, but may not necessarily be equal in size, to simplify the structural design of the display substrate. The areas of each auxiliary island 21 and each island 11 are not limited, as long as the elastic modulus of the portion of the base layer 100 in each transition region 20 is larger than that of the display region 1 and smaller than that of the non-opening region 25 of the corresponding non-display region 2.

In the present embodiment, the sizes of each opening 12 of the display region 1 and each auxiliary opening 22 of the transition region 20 are set to be different, such that an appropriate combination structure of the auxiliary islands 21 and the auxiliary bridges 23 is obtained by adjusting the size of each auxiliary opening 22, so as to obtain the elastic modulus that meets the above requirement. Referring to FIGS. 2 and 8, the size of each auxiliary island 21 of each transition region 20 may be equal to the size of each island 11 of the opening region 10 adjacent to the transition region 20, the width B2 of each auxiliary bridge 23 of each transition region 20 may be greater than the width b2 of each bridge 13 of the opening region 10 adjacent to the transition region 20, and the elastic modulus of the transition region 20 is greater than that of the display region 1 but less than that of the non-opening region 25 of each non-display region 2.

Specifically, the elastic modulus of the base layer 100 in each transition region 20 may be adjusted by changing the length B1 of each auxiliary bridge 23 in a case where the size of each auxiliary island 21 in each transition region 20 is the same as the size of each island 11 of the opening region 10 in the display region 1 adjacent to the transition region 20. The wider each auxiliary bridge 23 (i.e., the larger B1) is, the larger the elastic modulus of the structure is and the smaller the deformation is. The lengths B1 of auxiliary bridges 23 disposed in each transition region 20 may gradually increase in a direction from the display region 1 to a corresponding non-opening region 25, such that the elastic modulus of each transition region 20 gradually increases in the direction from the display region 1 to the corresponding non-opening region 25. The gradient distribution of the elastic modulus of each transition region 20 is achieved by the gradual change of the lengths B1 of the auxiliary bridges 23, thereby achieving the effect of distributing the stress concentrated at the boundary between the display region 1 and each non-display region 2 to each transition region 20. For example, the length B1 of the auxiliary bridge 23 in FIG. 8 may be greater than the length b1 of the bridge 13 in FIG. 2 (i.e., B1>b1). In addition, the width C2 of the auxiliary opening 22 may be equal to the width B2 of the auxiliary bridge 23 (i.e., C2=B2), and the length C1 of the auxiliary opening 22 may be equal to the length c1 of the opening 12 (i.e., C1=c1).

In another embodiment of the present disclosure, in order to solve the problem that the boundary between the display region 1 and each non-display region 2 is easily fractured, a film may be further disposed on the transition region 20 of the display substrate. The display substrate according to the present embodiment may be based on the embodiment shown in FIG. 8, and an auxiliary film may be disposed on each of the transition regions 20 of the base layer 100, and a thickness of the auxiliary film increases in a direction from the display region 1 to the non-opening region 25 of each non-display region 2.

Figure 9:
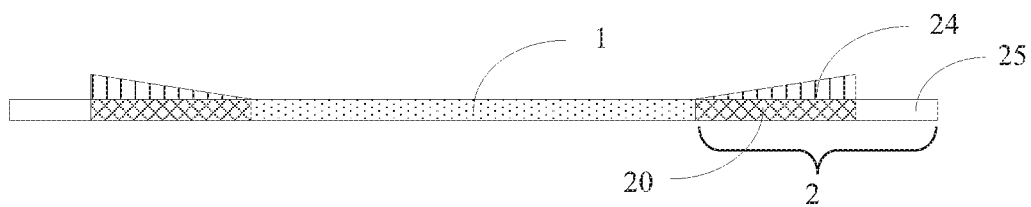
FIG. 9 is a schematic diagram showing a structure of a display substrate according to an embodiment of the present disclosure.

As shown in FIG. 9, the size of each auxiliary opening 22 in each transition region 20 and the size of each opening 12 in the opening region 10 of the display region 1 adjacent to the transition region 20 may be the same or different, and an auxiliary film 24 for further adjusting the elastic modulus may be added to change the overall thickness of each transition region 20. The auxiliary film 24 achieves a gradual change in elastic modulus by a gradual change in thickness thereof. Specifically, the auxiliary film 24 becomes thinner gradually in the direction from a corresponding non-opening region 25 to the display region 1, and thus the elastic modulus of the transition region 20 gradually decreases in the direction from the corresponding non-opening region 25 to the display region 1.

The display substrate includes transition regions 20 with gradually changed elastic modulus. That is, in the display substrate, for the case where the deformation of the display region 1 is large but the deformation of each non-display region 2 is small, the auxiliary film 24 is arranged on each transition region 20, and the elastic modulus of the transition region 20 is adjusted to be larger than that of the display region 1 and smaller than that of the non-opening region 25 of the corresponding non-display region 2 by utilizing the gradually changed thickness of the auxiliary film 24, which is advantageous for achieving a stress distribution from the display region 1 to the non-display region 2.

For example, the auxiliary film 24 may be made of at least one of silicon nitride, silicon oxide, polyimide, and a metal of titanium. The auxiliary film 24 made of the above material(s) is simple in process and high in yield. Alternatively, since other films are generally formed in the process of manufacturing the light emitting devices over the display substrate, the auxiliary film 24 may also be formed by retaining a portion of the other films on each transition region 20 and adjusting a thickness of the portion of the other films while manufacturing the other films of the light emitting devices. That is, the auxiliary film 24 and the portion of the other films of the light emitting devices may be manufactured by a same process, thereby simplifying the manufacturing process and saving the manufacturing cost.

In the display substrate according to the present embodiment, the auxiliary film is disposed on each transition region and the structure of the auxiliary film is adjusted (e.g., the thickness of the auxiliary film is gradually increased in the direction from the display region to each of the non-opening regions), to strengthen a local portion of the display substrate, so as to adjust the elastic modulus at the boundary between the display region and each of the non-display regions, and effectively solve the problem of stress concentration on the display substrate at the boundary between the display region and each of the non-display regions.

The above-described embodiments of the present disclosure may achieve at least the following advantageous effects. The display substrate may effectively solve the problem of stress concentration at the boundaries between the bridges and the openings in different regions of the display region, thereby solving the problem of degradation of the display effect caused by the difference in distance between the pixels due to nonuniform stretching deformation, and improving the display effect of the display substrate after being stretched or compressed. In addition, the elastic modulus of each of the transition regions is uniformly decreased from the non-opening region of the corresponding non-display region to the display region by changing the structure of the transition region between the display region and the non-display region. Therefore, the problem of stress concentration on the display substrate at the boundary between the display region and each of the non-display regions is solved, and the display effect and the stretchable properties of the display substrate are further improved.

Another embodiment of the present disclosure provides a display device, which includes the display substrate according to any one of the embodiments shown in FIGS. 1 to 9. At least some of the islands of the display substrate are provided with light emitting devices thereon, and at least some of the bridges of the display substrate are provided with wires thereon for connecting the light emitting devices to each other.

The display device may be manufactured by the following steps. First, an entire layer structure for the base layer 100 is placed on glass, and a thin film transistor (TFT) device is formed on the entire layer structure. Next, in a patterning process, a pattern is defined by exposing the entire layer structure for the base layer 100 with yellow light, and the plurality of openings 12 are formed in the entire layer structure by developing and etching, thereby forming the continuous and hollowed-out base layer 100 having the islands and the bridges. Then, a pixel limiting layer is formed, and an organic light emitting material is vapor deposited therein and packaged. Finally, the base layer 100 is separated from the glass to obtain a stretchable display device.

In the display device, each of the light emitting devices may be an organic light emitting diode (OLED) device, or a quantum dot light emitting diode (QLED) device. The display device may be any product or component with a display function, such as a desktop computer, a tablet computer, a notebook computer, a mobile phone, a personal digital assistant (PDA), a global positioning system (GPS), a vehicle-mounted display, a projection display, a video camera, a digital camera, an electronic watch, a calculator, an electronic instrument, a meter, a liquid crystal panel, electronic paper, a television, a monitor, a digital photo frame, a navigator, and the like, and may be applied to multiple fields such as public display and illusion display.

The display device may have, on one hand, the reduced difference in display effect due to deformation of the display region, and on the other hand, may not be prone to fracture at the boundary between the display region and each non-display region. As a result, the display device has excellent physical properties and display performance, and thus has a significantly improved display effect.

It should be understood that the above embodiments are merely exemplary embodiments for explaining the principles of the present disclosure, and the present disclosure is not limited thereto. It would be apparent to one of ordinary skill in the art that various changes and modifications may be made without departing from the scope of the present disclosure as defined in the appended claims, and these changes and modifications also fall within the scope of the present disclosure.

What is claimed is:

1. A display substrate, comprising a base layer that comprises at least a display region, wherein the display region comprises a plurality of opening regions, each of the plurality of opening regions comprises a plurality of islands spaced apart from each other by a plurality of openings and connected to each other by a plurality of bridges, and at least two of the plurality of opening regions have different stiffnesses.

2. The display substrate according to claim 1, wherein the plurality of opening regions have different stiffnesses.

3. The display substrate according to claim 2, wherein the plurality of opening regions comprise a first opening region and a second opening region that are arranged alternately, the first opening region has a first stiffness, the second opening region has a second stiffness, and the first stiffness is not equal to the second stiffness.

4. The display substrate according to claim 1, wherein each of the plurality of openings is a rectangle, each of the plurality of bridges is a rectangle, and each of the plurality of islands is a rectangle.

5. The display substrate according to claim 4, wherein in adjacent two of the plurality of opening regions, the islands have a same size, and the bridges between adjacent ones of the islands have different lengths.

6. The display substrate according to claim 4, wherein in adjacent two of the plurality of opening regions, the islands have different sizes, and the bridges between adjacent ones of the islands have different lengths.

7. The display substrate according to claim 4, wherein in the opening regions having a same stiffness, the islands have a same size, and the bridges between adjacent ones of the islands have a same length.

8. The display substrate according to claim 4, wherein in adjacent two of the plurality of opening regions, an area of each opening of the opening region having a larger stiffness, is smaller than an area of each opening of the opening region having a smaller stiffness.

9. The display substrate according to claim 1, wherein each island is defined by four openings of the plurality of openings and four bridges of the plurality of bridges, and each of the four bridges is at one end of a respective one of the four openings and at four corners of the island.

10. The display substrate according to claim 9, wherein a width of each bridge is equal to a width of the opening at one end of which the bridge is located and less than a width of the island adjacent to the bridge, and a length of the bridge is at least a width of one wire.

11. The display substrate according to claim 1, wherein the base layer further comprises non-display regions at both sides of the display region, respectively, each non-display region comprises a transition region adjacent to the display region, and a stiffness of the transition region is greater than that of the display region and less than that of another region of the non-display region other than the transition region.

12. The display substrate according to claim 11, wherein the stiffness of the transition region increases in a direction from the display region to the another region of the non-display region.

13. The display substrate according to claim 11, wherein the transition region comprises a plurality of auxiliary islands spaced apart from each other by a plurality of auxiliary openings and connected to each other by a plurality of auxiliary bridges, and a distance between adjacent two of the auxiliary islands is different from a distance between adjacent two of the islands.

14. The display substrate according to claim 13, wherein a shape of each of the auxiliary islands is the same as a shape of each of the islands.

15. The display substrate according to claim 3, wherein each of two outermost opening regions respectively at two opposite sides of the plurality of opening regions is the second opening region, and the second stiffness is less than the first stiffness.

16. The display substrate according to claim 15, wherein the second stiffness is 70% to 99% of the first stiffness.

17. The display substrate according to claim 13, further comprising an auxiliary film on each transition region, wherein the auxiliary film has a thickness increasing in a direction from the display region to the other region of the non-display region comprising the transition region.

18. The display substrate according to claim 17, wherein a material of the auxiliary film comprises at least one of silicon nitride, silicon oxide, polyimide, and a metal of titanium.

19. A display device, comprising:
   the display substrate according to claim 1;
   light emitting devices on at least a portion of the plurality of islands, respectively; and
   wires respectively on at least a portion of the plurality of bridges for connection to the light emitting devices.

20. The display substrate according to claim 2, wherein each island is defined by four openings of the plurality of openings and four bridges of the plurality of bridges, and each of the four bridges is at one end of a respective one of the four openings and at four corners of the island.

* * * * *